(12) United States Patent
Singor et al.

(10) Patent No.: US 6,828,854 B2
(45) Date of Patent: Dec. 7, 2004

(54) METHOD AND CIRCUIT FOR A DUAL SUPPLY AMPLIFIER

(75) Inventors: Frank W. Singor, Laguna Beach, CA (US); Arya R. Behzad, Danville, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/745,688

(22) Filed: Dec. 29, 2003

(65) Prior Publication Data

US 2004/0135638 A1 Jul. 15, 2004

Related U.S. Application Data

(63) Continuation of application No. 09/920,842, filed on Aug. 3, 2001, now Pat. No. 6,677,818.
(60) Provisional application No. 60/224,114, filed on Aug. 9, 2000, and provisional application No. 60/223,110, filed on Aug. 3, 2000.

(51) Int. Cl.[7] .............................................. H03G 5/16
(52) U.S. Cl. ...................... 330/133; 330/310; 330/134; 330/297; 330/299; 341/155
(58) Field of Search ................................ 330/133, 134, 330/297, 310, 311, 296, 299; 327/63, 333; 341/155

(56) References Cited

U.S. PATENT DOCUMENTS

| | | | |
|---|---|---|---|
| 4,531,099 A | 7/1985 | Nakane | 330/267 |
| 4,562,406 A | 12/1985 | Baker | 330/85 |
| 4,583,052 A | 4/1986 | Ishii | 330/297 |
| 5,001,441 A | 3/1991 | Gen-Kuong | 330/294 |
| 5,182,527 A | 1/1993 | Nakanishi et al. | 330/285 |
| 5,463,350 A * | 10/1995 | Yamaji | 330/296 |
| 5,831,477 A | 11/1998 | Tsumura | 330/51 |
| 5,855,268 A | 1/1999 | Zoladz, Jr. | 330/254 |
| 5,867,048 A | 2/1999 | Chou | 327/172 |
| 5,892,404 A | 4/1999 | Tang | 330/297 |
| 5,990,951 A | 11/1999 | Koyama | 330/133 |
| 6,323,729 B1 | 11/2001 | Sevenhans et al. | 330/51 |
| 6,677,818 B2 * | 1/2004 | Singor et al. | 330/133 |

FOREIGN PATENT DOCUMENTS

| | | |
|---|---|---|
| EP | 1 014 563 A1 | 6/2000 |
| FR | 2 513 457 | 3/1983 |
| JP | 363286015 A * | 11/1988 |

OTHER PUBLICATIONS

Ito et al. "A 10bit20MS/s 3V Supply CMOS A/D Converter" IEEE Journal of Solid–State Circuits, vol. 29, Issue 12, Dec. 1994 pp 1531–1536.*

Copy of International Search Report issued Oct. 31, 2002 for Appl. No. PCT/US01/41534, 6 pages.

* cited by examiner

Primary Examiner—Michael B. Shingleton
(74) Attorney, Agent, or Firm—Sterne, Kessler, Goldstein & Fox P.L.L.C.

(57) ABSTRACT

A circuit and method for bridging an analog signal between two integrated circuits operating at different supply voltages. The circuit is a two stage fixed gain amplifier. The first stage is a transconductance amplifier and the second stage is an operational amplifier. The first stage converts an input signal from a voltage into a current. The second stage converts the current signal to an output voltage signal.

12 Claims, 4 Drawing Sheets

METHOD AND CIRCUIT FOR A DUAL SUPPLY AMPLIFIER

CROSS-REFERENCE TO RELATED APPLICATIONS

This application is a continuation of U.S. patent application Ser. No. 09/920,842, filed on Aug. 3, 2001 now U.S. Pat. No. 6,677,818 which claims benefit of U.S. Provisional Application No. 60/223,110 filed Aug. 3, 2000, and U.S. Provisional Application No. 60/224,114 filed Aug. 9, 2000, all of which are incorporated by reference herein in their entirety.

BACKGROUND OF THE INVENTION

1. Field of the Invention

This invention relates to analog amplifiers, and in particular to a fixed gain amplifier biased from two supply voltages.

2. Background Art

Analog integrated circuits are designed and fabricated in bipolar technology, in MOS technology, and in technologies that combine both types of devices in one process. The necessity of combining complex digital functions on the same integrated circuit with analog functions has resulted in increased use of digital MOS technologies for analog functions, particularly those functions such as analog-digital conversion required for interfaces between analog signals and digital systems.

When analog devices are implemented in the same technology as digital circuitry, the supply voltages used for the digital and the analog devices are the same. The selection of a supply voltage for a combined analog and digital circuit forces a tradeoff of the benefits of higher supply voltages against the benefits of lower supply voltages. In some cases, the semiconductor process used for a particular device may be chosen based on the associated supply voltage.

If the supply voltage is not sufficient for proper biasing and operation of the analog device, the analog components will induce noise into the analog signal. If the supply voltage is increased to properly bias the analog components, power consumption rises with the voltage increase.

In conventional designs, the analog devices are biased with a supply voltage sufficient for proper bias and operation. In the same circuit, the digital components are powered by a reduced voltage to reduce power consumption. The analog-digital conversion device receiving the analog input signal is powered from the analog supply voltage. Bridging the signal from the analog supply voltage to the digital supply voltage occurs after the analog to digital conversion is complete.

What is needed is a circuit and method for bridging an analog signal between two supply voltages to allow each analog device to use the supply voltage that provides minimum signal distortion and minimum power consumption.

BRIEF SUMMARY OF THE INVENTION

The invention comprises a circuit and method for coupling analog signals between a circuit biased from a higher supply voltage to a circuit biased from a lower supply voltage. The invention comprises a transconductance amplifier coupled to an operational amplifier. The transconductance amplifier is biased using a higher supply voltage than the operational amplifier.

The transconductance amplifier receives an input voltage signal and converts it into an analog current. The analog current is coupled to the operational amplifier where it is amplified and output as an analog voltage representative of the input voltage signal.

Features and Advantages

Analog signals are bridged between devices biased with different supply voltages.

The higher voltage supply biases the transconductance amplifier for a more linear response.

The higher voltage supply also increases the transconductance amplifier signal to noise ratio.

The lower voltage supply biases the operational amplifier, reducing power consumption.

The invention is applicable to any two stage amplifier where first stage is biased from a high supply voltage and the higher current second (output) stage is biased from a lower voltage.

The invention allows reduced geometry devices to be implemented in the analog signal path.

BRIEF DESCRIPTION OF THE FIGURES

The present invention is described with reference to the accompanying drawings. In the drawings, like reference numbers indicate identical or functionally similar elements. Additionally, the leftmost digit(s) of a reference number identifies the drawing in which the reference number first appears.

DETAILED DESCRIPTION OF THE INVENTION

I. Example Circuit Application

Before describing the invention in detail, it is useful to describe an example circuit environment for the invention. The dual supply fixed gain amplifier invention is not limited to the analog front-end circuit environment that is described herein, as the dual supply fixed gain amplifier invention is applicable to other analog front-end and non analog front-end applications as will be understood to those skilled in the relevant arts based on the discussions given herein.

Figure 1:
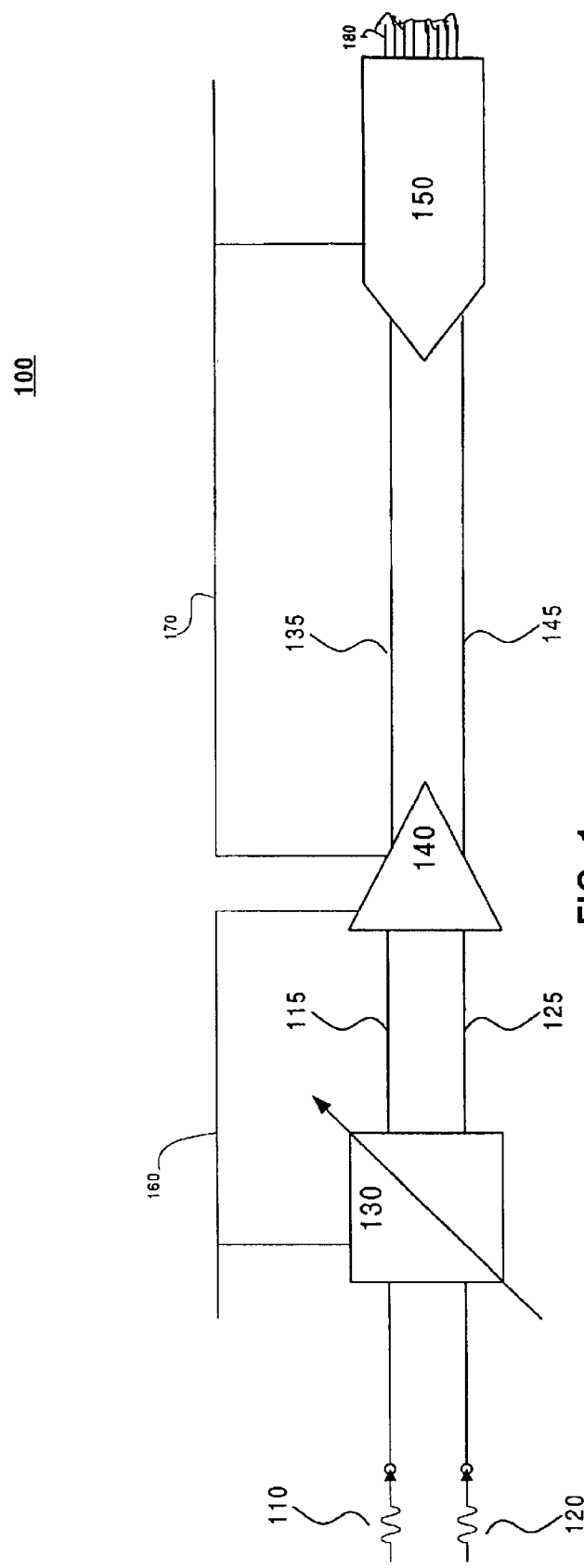
FIG. 1 illustrates an analog front-end circuit.

FIG. 1 illustrates an analog front-end 100 that is used to couple an analog signal into a digital device. The analog front-end 100 comprises a fixed gain amplifier 140 coupled to a programmable gain amplifier 130 and an analog-digital converter 150. A first supply voltage 160 is coupled to the programmable gain amplifier 130 and the fixed gain amplifier 140. A second supply voltage 170 is coupled to the fixed gain amplifier 140 and the analog-digital converter 150.

A positive analog signal 110 and a negative analog signal 120 are input to the programmable gain amplifier 130 and amplified by a desired gain. The positive analog signal 110 and a negative analog signal 120 are the positive and negative components of a differential signal. The amplified positive signal 115 and the amplified negative signal 125 are input to the fixed gain amplifier 140 and amplified by a second desired gain. The second amplified positive signal 135 and the second amplified negative signal 145 are input into the analog to digital converter 150 and converted to a digital output 180 that is representative of the difference between the positive analog signal 110 and the negative analog signal 120.

II. Dual Supply Amplifier

An embodiment of the present invention is now described. While specific methods and configurations are discussed, it should be understood that this is done for illustration purposes only. A person skilled in the art will recognize that other configurations and procedures may be used without departing from the spirit and scope of the invention.

Figure 2:
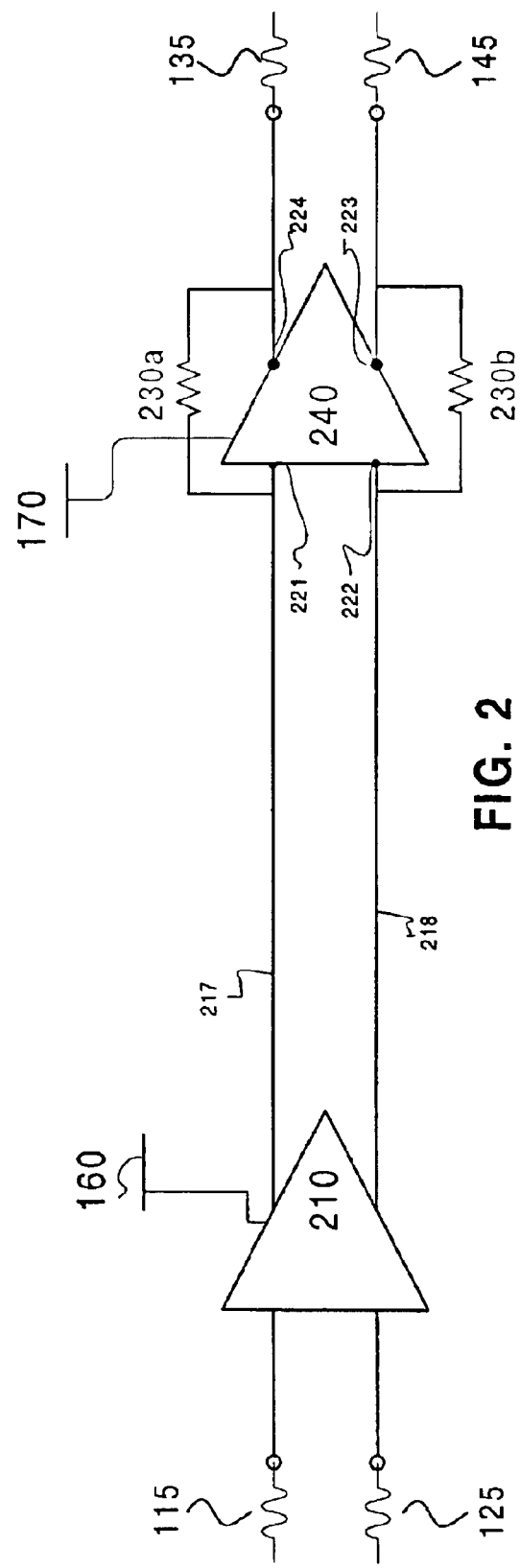
FIG. 2 illustrates a dual supply fixed gain amplifier.

FIG. 2 illustrates a dual source fixed gain amplifier 200. The dual source fixed gain amplifier 200 comprises a transconductance amplifier 210 coupled to a differential output operational amplifier 240. The transconductance amplifier 210 is biased from the first supply voltage 160. The operational amplifier 240 is biased from the second supply voltage 170. In one embodiment, the second supply voltage 170 is less than the first supply voltage 160.

The amplified positive signal 115 is applied to the transconductance amplifier 210 and converted into a positive analog current 217 proportional to the amplified positive signal 115. The amplified negative signal 125 is applied to the transconductance amplifier 210 and converted into a negative analog current 218 proportional to the amplified negative signal 125. The positive analog current 217 is applied to the positive input 221 of the operational amplifier 240. The negative analog current 218 is applied to the negative input 222 of the operational amplifier 240. The operational amplifier 240 acts to cause the second amplified positive signal 135 to be the product of the positive analog current 217 and a resistor 230a. The operational amplifier 240 acts to cause the second amplified negative signal 145 to be the product of the negative analog current 218 and a resistor 230b.

Figure 3:
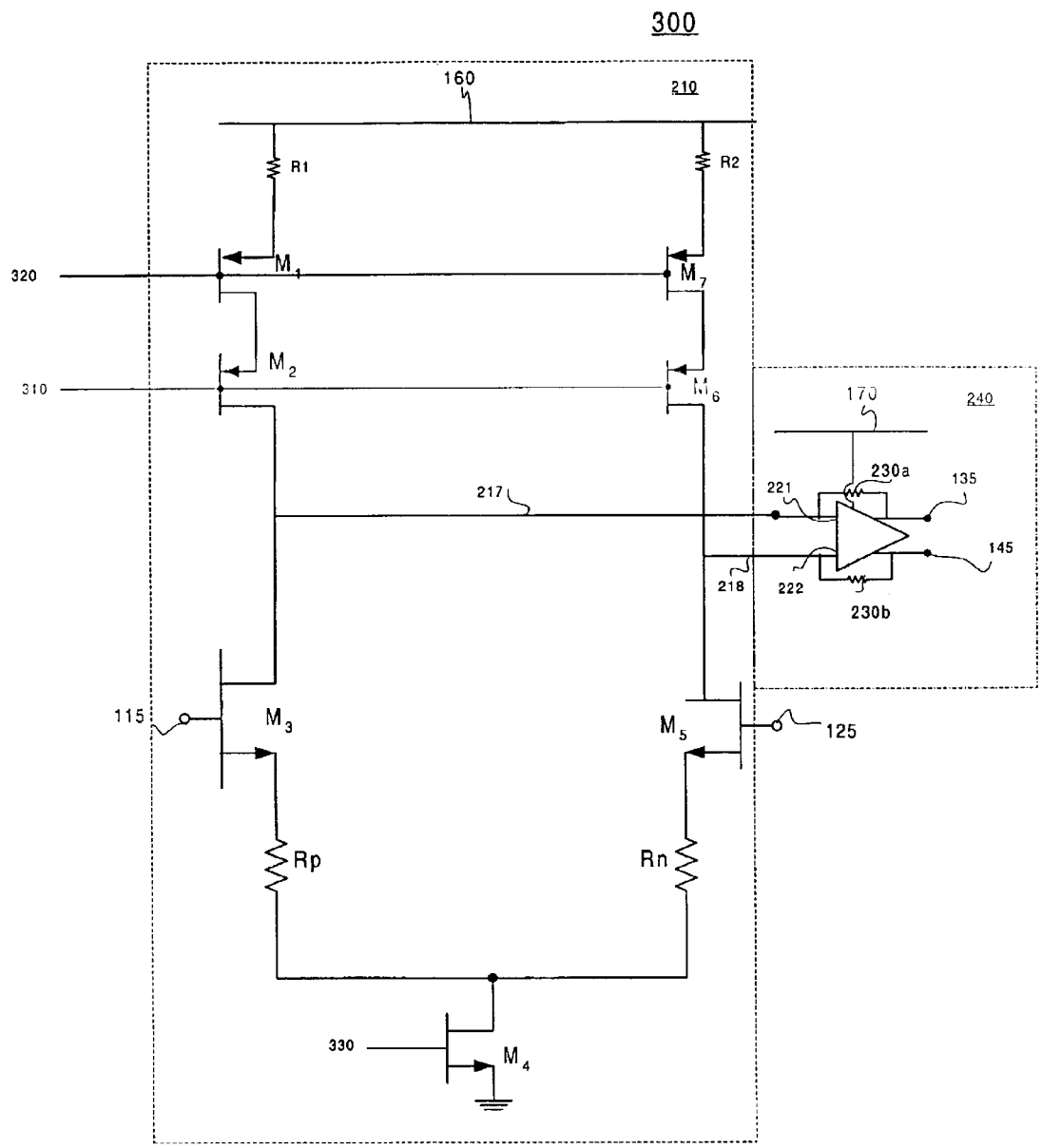
FIG. 3 illustrates a circuit embodiment of a dual supply fixed gain amplifier.

FIG. 3 illustrates a circuit embodiment of a dual source fixed gain amplifier 300. The transconductance amplifier 210 and the operational amplifier 240 are shown in dotted lines. The dual source fixed gain amplifier comprises a transistor M1 and a transistor M2 coupled between the first supply voltage 160 and a positive input transistor M3. A resistor R1 is coupled between M1 and the first supply voltage 160. A transistor M6 and a transistor M7 are coupled between the first supply voltage 160 and a negative input transistor M5. A resistor R2 is coupled between M7 and the first supply voltage 160. A resistor Rp is coupled between the positive input transistor M3 and a tail current transistor M4. A second resistor Rn is coupled between the negative input transistor M5 and the tail current transistor M4. Transistors M1 and M7 are biased by a first bias 320. Transistors M2 and M6 are biased by a second bias 310 and the tail current transistor M4 is biased by a third bias 330. The positive input 221 is coupled between transistors M2 and M3. The negative input 222 is coupled between transistors M5 and M6. The operational amplifier 240 is biased from a second supply voltage 170.

The amplified positive signal 115 is applied to M3 causing M3 to conduct a positive analog current 217 supplied from M1 and M2. The positive analog current 217 is proportional to the amplified positive signal 115. The amplified negative signal 125 is applied to M5 causing M5 to conduct a negative analog current 218 from M6 and M7. The negative analog current 218 is proportional to the amplified negative signal 125. In summary, transistors M3 and M5 convert the differential voltage formed by 115,125 to differential currents 217,218. In one embodiment, the transconductance gain of the voltage/current conversion is 1. The transistors M1 and M2 operate as current sources for M3. Likewise, M6 and M7 also operate as current sources for M5.

The positive analog current 217 is applied to the positive input 221. The negative analog current 218 is applied to the negative input 222. The operational amplifier 240 maintains the second amplified positive signal 135 equal to the voltage caused by the positive analog current 117 flowing through the resistor 230a. The operational amplifier 240 maintains second amplified negative signal 145 equal to the voltage caused by the negative analog current 118 flowing through the resistor 230b. In summary, the operational amplifier amplifies the differential current represented by 221,222 to generate a differential output voltage having components 135,145, where amplification is determined by the feedback resistors 230a and 230b.

The first supply voltage 160 minus the voltage drop across R1, M1, M2, M3, Rp and M4 is equal to zero. Allowing a larger voltage drop across R1, M1 and M2 improves the linear response of M1 and M2 as a current source. The improved linear response equates to reduced noise on the positive analog current 217. Less noise improves the signal to noise ratio in the positive analog current. Similarly, increasing the voltage drop across R2, M6 and M7 improves the linearity of M6 and M7 as a current source. The improved linear response reduces noise and increases the signal to noise ratio in the negative analog current 218. With the voltage drop across M3, Rp and M4 held constant, a larger voltage drop across R1, M1 and M2 requires a larger first supply voltage 160. A larger value for the first supply voltage 160 will improve the signal to noise performance in the transconductance amplifier 210.

The operational amplifier 240 maintains the positive analog current 217 through the resistor 230a. The power consumed in generating the second amplified positive analog signal 135 is the product of the second supply voltage 170 and the positive analog current 217. Power consumption in the operational amplifier 240 will be reduced if the second supply voltage 170 is reduced. For example, in the embodiment with an input voltage of 1.25V+/−100 mV and the first reference voltage 160=2.5V, and the second reference voltage 170=1.8V, the positive analog current 217=10 mA. The power dissipated in the operational amplifier 240 is reduced by the product of the supply voltage reduction and the current flowing at that voltage. For this example the reduction=(2.5−1.8)(10 mA)=7 mW. In other words, the dissipated power is less than it would be if both power supplies 160 and 170 were operated at 2.5 voltage.

The gain of the operational amplifier 240 could be varied by adjusting the resistor 230.

Reduced geometry semiconductor processes generally use reduced supply voltages for device biasing. Reduced geometry processes are also capable of operating at faster clock rates because of the shortened signal paths and reduced propagation delay. The present invention can be used to bridge an analog signal between different semiconductor geometry processes and implement devices in the semiconductor geometry that optimizes the devices function. In the analog front-end 100, bridging an analog signal from the first supply voltage 160 to the second supply voltage 170 enables the analog-digital converter 150 to be implemented in a reduced geometry process.

The present invention is also applicable to other two stage amplifiers embodiments. The supply voltage bridge can be used when a first stage requires a high bias voltage for linear operation and an output stage requires a lower bias voltage to reduce power consumption.

The preferred embodiment has been described using differential input and output signals. Alternate embodiments include single-ended input and output signals. The circuit modifications necessary to implement a single-ended signal bridge between different supply voltages would be apparent to one of skill in the art.

Figure 4:
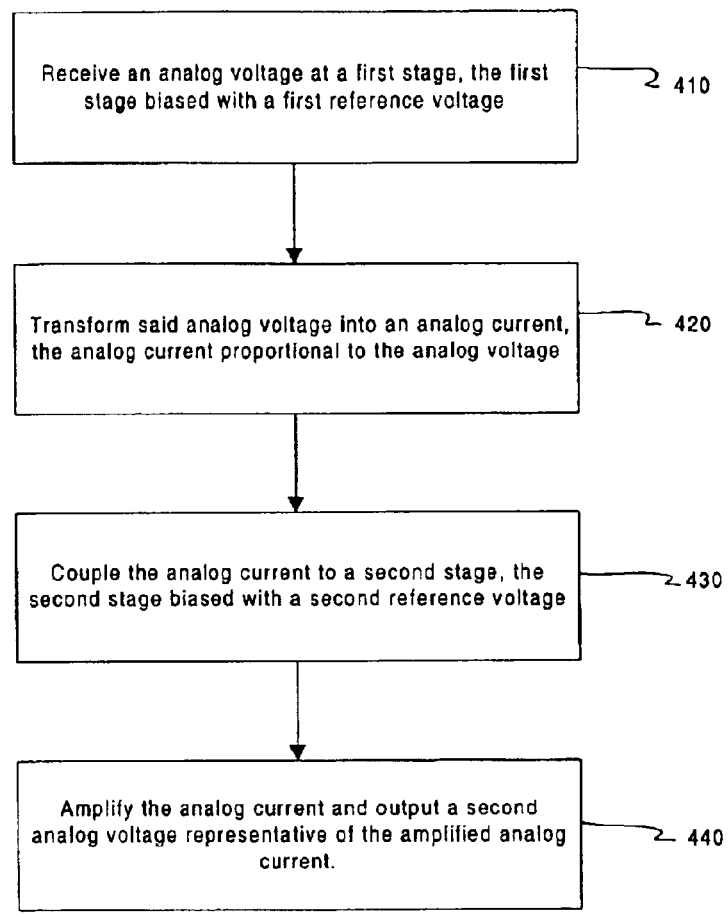
FIG. 4 illustrates the steps of a method for bridging an analog signal between two supply voltages.

FIG. 4 illustrates a method of amplifying an analog signal consistent with the invention discussed herein. In step 410, an analog voltage is received at a first stage, the first stage biased with a first reference voltage. In step 420, the analog voltage is transformed into an analog current, the analog current proportional to the analog voltage. In step 430, the analog current is coupled to a second stage, the second stage biased with a second reference voltage. In step 440, the analog current is amplified and output as a second analog voltage, the second analog voltage representative of the amplified analog current.

Conclusion

While various embodiments of the present invention have been described above, it should be understood that they have been presented by way of example only, not limitation. Thus, the breadth and scope of the present invention should not be limited by any of the above described exemplary embodiments and arrangements, but should be defined only in accordance with the following claims and their equivalents.

The present intention has been described above with the aid of functional building blocks and circuit diagrams illustrating the performance of specified functions and relationships thereof. The boundaries of the functional building blocks and circuit diagrams illustrating the performance of specified functions and relationships thereof. The boundaries of the functional building blocks have been arbitrarily defined herein for the convenience of the description. Alternate boundaries can be defined so long as the specified functions and relationships thereof are appropriately performed. Any such alternate boundaries are this within the scope and spirit of the claimed invention. One skilled in the art will recognize that these functional building blocks can be implemented using discrete circuit components, circuit components constructed on an IC chip, or any combination thereof. Thus, the breadth and scope of the present invention should not be limited by any of the above described exemplary embodiments, but should be defined only in accordance with the following claims and their equivalents.

What is claimed is:

1. A system, comprising:
   a first amplifier adapted to receive a differential input analog signal, said first amplifier biased with a first reference voltage;
   a converter outputting a digital signal representative of said differential input analog signal, said converter biased with a second reference voltage; and
   a second amplifier coupled between said first amplifier and said converter, said second amplifier bridging said differential input analog signal from said first reference voltage to said second reference voltage.

2. The system of claim 1, wherein said second amplifier further comprises:
   a first stage biased at said first reference voltage, said first stage coupled to an output of said first amplifier;
   a second stage biased at said second reference voltage, said second stage coupled between said first stage and said converter.

3. The system of claim 2, wherein said first stage is a transconductance amplifier and said second stage is an operational amplifier.

4. The system of claim 2, wherein said first stage and said second stage are disposed on a common substrate.

5. The system of claim 4, wherein said common substrate is a CMOS substrate.

6. The system of claim 1, wherein said first reference voltage is greater than said second reference voltage.

7. A system, comprising:
   a first amplifier adapted to receive an input analog signal, said first amplifier biased with a first reference voltage;
   a converter outputting a digital signal representative of said input analog signal, said converter biased with a second reference voltage; and
   means for bridging said input signal from said first reference voltage to said second reference voltage.

8. The system of claim 7, wherein said means for bridging includes a second amplifier coupled between said first amplifier and said converter, said second amplifier bridging said input analog signal from said first reference voltage to said second reference voltage.

9. The system of claim 7, wherein said first reference voltage is greater than said second reference voltage.

10. A method of processing an analog signal, comprising the steps of:
    receiving said analog signal;
    amplifying said analog signal using a first reference voltage, resulting in an amplified analog signal;
    converting said amplified analog signal to a digital signal representative of said amplified analog signal, said step of converting using a second reference voltage; and
    bridging said amplified analog signal from said first reference voltage to said second reference voltage prior to said step of converting.

11. The method of claim 10, wherein said step of bridging includes the steps of:
    transforming said amplified analog signal from an analog voltage into an analog current using said first reference voltage, said analog current proportional to said analog voltage; and
    amplifying said analog current using said second reference voltage and outputting a second analog voltage representative of said amplified analog current.

12. The method of claim 11, wherein said first reference voltage is greater than said second reference voltage.

* * * * *